United States Patent
Ferstl et al.

(10) Patent No.: US 9,076,920 B2
(45) Date of Patent: Jul. 7, 2015

(54) AQUEOUS ALKALINE ETCHING AND CLEANING COMPOSITION AND METHOD FOR TREATING THE SURFACE OF SILICON SUBSTRATES

(75) Inventors: Berthold Ferstl, Bensheim (DE); Simon Braun, Mannheim (DE); Achim Fessenbecker, Waghaeusel (DE)

(73) Assignee: BASF SE, Ludwigshafen (DE)

( * ) Notice: Subject to any disclaimer, the term of this patent is extended or adjusted under 35 U.S.C. 154(b) by 269 days.

(21) Appl. No.: 13/703,233

(22) PCT Filed: Jun. 1, 2011

(86) PCT No.: PCT/IB2011/052418
§ 371 (c)(1),
(2), (4) Date: Dec. 10, 2012

(87) PCT Pub. No.: WO2011/154875
PCT Pub. Date: Dec. 15, 2011

(65) Prior Publication Data
US 2013/0078756 A1 Mar. 28, 2013

Related U.S. Application Data

(60) Provisional application No. 61/352,831, filed on Jun. 9, 2010.

(51) Int. Cl.
| | |
|---|---|
| H01L 21/461 | (2006.01) |
| H01L 31/18 | (2006.01) |
| C11D 7/32 | (2006.01) |
| C11D 7/34 | (2006.01) |
| C11D 7/36 | (2006.01) |
| C11D 11/00 | (2006.01) |
| C09K 13/00 | (2006.01) |
| C09K 13/06 | (2006.01) |
| H01L 21/306 | (2006.01) |

(52) U.S. Cl.
CPC .......... *H01L 31/1804* (2013.01); *C11D 7/3209* (2013.01); *C11D 7/34* (2013.01); *C11D 7/36* (2013.01); *C11D 11/0047* (2013.01); *H01L 21/306* (2013.01); *C09K 13/00* (2013.01); *C09K 13/06* (2013.01); *H01L 21/30604* (2013.01); *Y02E 10/547* (2013.01)

(58) Field of Classification Search
CPC .............. Y02E 10/547; H01L 31/0236; H01L 31/1804; H01L 31/022425; H01L 31/068; H01L 31/18; H01I 21/31111; H01I 21/32134; H01I 21/02052; H01I 21/02063; H01I 21/02071; H01I 21/306; H01I 21/30604; H01I 31/1804; C11D 11/0047; C11D 3/30; C11D 7/32; C11D 7/34; C11D 3/044
USPC ................... 438/745, 753, 906, 974
See application file for complete search history.

(56) References Cited

U.S. PATENT DOCUMENTS

| | | |
|---|---|---|
| 4,239,661 A | 12/1980 | Muraoka et al. |
| 5,129,955 A | 7/1992 | Tanaka |
| 5,207,866 A | 5/1993 | Lue et al. |
| 5,466,389 A | 11/1995 | Hardi et al. |
| 5,498,293 A | 3/1996 | Hardi et al. |
| 5,705,089 A | 1/1998 | Sugihara et al. |
| 6,417,147 B2 | 7/2002 | Amemiya et al. |
| 6,465,403 B1 | 10/2002 | Skee |
| 6,585,825 B1 | 7/2003 | Skee |
| 7,838,761 B2 | 11/2010 | Lee |
| 2006/0154839 A1 | 7/2006 | Hardi et al. |
| 2006/0226122 A1 | 10/2006 | Wojtczak et al. |
| 2009/0239777 A1 | 9/2009 | Angst et al. |
| 2009/0311628 A1 | 12/2009 | Liu et al. |
| 2010/0319735 A1 | 12/2010 | Hidaka et al. |
| 2011/0017290 A1 | 1/2011 | Lee |
| 2012/0160320 A1 | 6/2012 | Braun et al. |
| 2012/0164474 A1 | 6/2012 | Hueffer et al. |

FOREIGN PATENT DOCUMENTS

| | | |
|---|---|---|
| CN | 1546627 | 11/2004 |
| CN | 101248516 | 8/2008 |
| CN | 101604615 | 12/2009 |
| CN | 101720352 | 6/2010 |
| DE | 27 49 636 | 5/1978 |
| EP | 0 496 602 | 7/1992 |
| EP | 0 665 582 | 8/1995 |
| JP | 50 158281 | 12/1975 |
| JP | 63 48830 | 3/1988 |
| JP | 63 274149 | 11/1988 |
| JP | 2004 203901 | 7/2004 |
| WO | 02 33033 | 4/2002 |
| WO | 2008 062953 | 5/2008 |

OTHER PUBLICATIONS

International Search Report Issued Oct. 27, 2011 in PCT/IB11/052418 Filed Jun. 1, 2011.

*Primary Examiner* — Michelle Mandala
(74) *Attorney, Agent, or Firm* — Oblon, McClelland, Maier & Neustadt, L.L.P.

(57) ABSTRACT

An aqueous alkaline etching and cleaning composition for treating the surface of silicon substrates, the said composition comprising: (A) a quaternary ammonium hydroxide; and (B) a component selected from the group consisting of water-soluble acids and their water-soluble salts of the general formulas (I) to (V): $(R^1—SO_3-)_n X^{n+}$ (I), $R—PO_3^{2-}(X^{n+})_{3-n}$ (II); $(RO—SO_3-)_n X^{n+}$ (III), $RO—PO_3^{2-}(X^{n+})_{3-n}$ (IV), and $[(RO)_2PO_2-]_n X^{n+}$ (V); wherein the n=1 or 2; X is hydrogen or alkaline or alkaline-earth metal; the variable R1 is an olefinically unsaturated aliphatic or cycloaliphatic moiety and R is $R^1$ or an alkylaryl moiety; the use of the composition for treating silicon substrates, a method for treating the surface of silicon substrates, and methods for manufacturing devices generating electricity upon the exposure to electromagnetic radiation.

32 Claims, No Drawings

AQUEOUS ALKALINE ETCHING AND CLEANING COMPOSITION AND METHOD FOR TREATING THE SURFACE OF SILICON SUBSTRATES

FIELD OF THE INVENTION

The present invention is directed to a novel aqueous alkaline etching and cleaning composition useful for treating the surface of silicon substrates.

Moreover, the present invention is directed to a novel method for treating the surface of silicon substrates making use of the novel aqueous alkaline etching and cleaning composition.

Additionally, the present invention is directed to a novel method for manufacturing devices generating electricity upon the exposure to electromagnetic radiation making use of the novel aqueous alkaline etching and cleaning composition and the novel method for treating the surface of silicon substrates.

CITED DOCUMENTS

The documents cited in the present application are incorporated by reference in their entirety.

BACKGROUND OF THE INVENTION

In the industrial production of solar cells, monocrystalline or polycrystalline silicon wafers are cut from massive ingots mainly by sawing. This creates a rough surface having a mean surface roughness of about 20 to 30 μm, customarily referred to in the art as saw damage. This saw damage is usually caused by metal attrition of the sawing wire and residual abrasives. It is therefore necessary to carry out a so-called saw damage etch to remove the surface roughness and to texturize the silicon wafer surface. This way, a certain roughness is created at the surface which roughness enables the multiple reflection of light incident on the surface, thereby leading to greater absorption of the light inside the silicon wafer, i.e., to an increased light-confining effect.

Following the texturization, short treatments of the textured wafers with either water or alkaline or acidic solutions can be carried out. Alternatively or additionally, a conventional finishing by a short treatment with a hydrogen fluoride containing solution can be carried out. The hydrogen fluoride removes the natural oxide layer at the surface of the silicon wafers accompanied by the formation of silicium-fluorine bonds. This way, an activated hydrophobic silicon surface is created.

The silicon tetrafluoride which is generated as an intermediary by the hydrofluoric acid treatment can react with water to produce colloidal silicon dioxide particles which tend to adhere to the activated silicon surface and may form spots or stains called "haze". Additionally, due to the surface tension of the water, the hydrophobicity of the surface leads to the formation of water droplets during the rinsing step. The colloidal particles however tend to concentrate on the vapor-liquid boundaries of the droplets. During the drying step the droplets can roll along the silicon wafer surface such that the colloidal particles contained in the droplets adhere to and re-contaminate the silicon wafer surface.

Moreover, the hydrophobic silicon wafer surface can hardly be wetted by highly polar spray-on phosphorus emitter sources such as aqueous or alcoholic phosphoric acid. Therefore, the silicon wafer surfaces have to be rendered hydrophilic before they can be contacted with the phosphorus emitter source.

Many aqueous alkaline etching and cleaning compositions for the treatment of the surface of silicon wafers have been proposed in the prior art.

Thus, already the Japanese patent application JP 50-158281 discloses the use of an aqueous solution of tetramethylammonium hydroxide (TMAH) and hydrogen peroxide for the cleaning of semiconductor wafer surfaces.

The American U.S. Pat. No. 4,239,661 proposes the use of an aqueous solution containing choline and hydrogen peroxide and additionally containing nonionic surfactants such as aliphatic esters of polyhydric alcohols or polyethyleneoxides, complexing agents such as cyanide or ethylenediaminetetraacetic acid (EDTA), triethanolamine, ethylenediamine or cuproin, for treating and washing of the surface of intermediate semiconductor products, the etching of metal layers and the removal of positive-working photoresists.

The German patent application DE 27 49 636 discloses the use of an aqueous composition containing TMAH, hydrogen peroxide, complexing agents such as ammonium hydroxide or pyrocathechol, fluorinated compounds as surfactants such as hexafluoroisopropanol, and inhibitors such as ammonium fluoride, ammonium biphosphate or oxygen.

The Japanese patent application JP 63-048830 discloses the removal of metal impurities from silicon substrate surfaces after a hydrofluoric acid treatment with an aqueous composition containing choline and hydrogen peroxide.

The Japanese patent application JP 63-274149 discloses the degreasing and the removal of inorganic contaminants from semiconductor wafer surfaces with aqueous compositions containing TMAH, hydrogen peroxide and nonionic surfactants.

The American U.S. Pat. No. 5,129,955 describes the cleaning and the hydrophilization of silicon wafer surfaces after the hydrofluoric acid treatment with an aqueous solution of choline or TMAH and hydrogen peroxide.

Likewise, the American U.S. Pat. No. 5,207,866 discloses the use of such compositions for the anisotropic etching of monocrystalline silicon.

The European patent application EP 0 496 602 A2 describes the removal of metal impurities from silicon wafers surfaces with aqueous compositions containing TMAH, hydrogen peroxide and complexing agents such as phosphonic acids or polyphosphoric acids.

The American U.S. Pat. No. 5,705,089 describes the removal of metal impurities from silicon wafers with aqueous compositions containing TMAH, hydrogen peroxide, complexing agents such as polyphosphonic acids, wetting agents such as polyhydric alcohols and anionic, cationic, nonionic and fluorinated surfactants, water-soluble organic additives such as alcohols, glycols, carboxylic acids, hydroxycarboxylic acids, polycarboxylic acids and polyhydric alcohols which may also be oxidized.

The European patent application EP 0 665 582 A2 proposes aqueous compositions containing TMAH, hydrogen peroxide and complexing agents having at least three N-hydroxylaminocarbamoyl groups as surface treating compositions for semiconductors and for the removal of metal ions.

The American U.S. Pat. No. 5,466,389 discloses the cleaning of silicon wafers leading to a reduced surface microroughness with aqueous compositions containing TMAH, hydrogen peroxide, nonionic surfactants, complexing agents and buffering components such as inorganic mineral acids and their salts, ammonium salts, weak organic acids and their salts and weak acids and their conjugate bases.

The American U.S. Pat. No. 5,498,293 proposes for this purpose aqueous compositions containing TMAH, hydrogen peroxide, amphoteric surfactants such as betaines, sulfobetaines, aminocarboxylic acid derivatives, iminodiacids, amine oxides, fluoroalkyl sulfonates or fluorinated alkyl amphoterics, complexing agents, and a propylene glycol ether solvent.

The American U.S. Pat. No. 6,465,403 B1 discloses alkaline cleaning and stripping compositions containing TMAH, hydrogen peroxide, quaternary ammonium silicates, complexing agents, water-soluble organic solvents, and amphoteric, nonionic, anionic or cationic surfactants.

The American U.S. Pat. No. 6,585,825 B1 discloses similar compositions additionally containing bath stabilizing agents such as weakly acidic or basic compounds, e.g., salicylic acid.

The American U.S. Pat. No. 6,417,147 describes cleaning compositions for removing contamination from the surface of semiconductor wafers, the compositions containing TMAH, hydrogen peroxide, fluorine containing anionic surfactants such as fluorinated alkenyl sulfonic acids having at least 6 carbon atoms to the molecule, alkanolamines, and nonionic surfactants.

The international patent application WO 02/33033 A1 discloses cleaning compositions for semiconductor wafers having metal lines and vias, the said compositions containing TMAH, hydrogen peroxide, a bath stabilizing agent such as salicylic acid, water-soluble silicates, complexing agents, and organic solvents.

The American US 2006/0154839 A1 discloses the use of aqueous compositions containing TMAH, hydrogen peroxide and phosphite or hypophosphite as stripping and cleaning compositions primarily for ash residue removal.

The American US 2006/0226122 discloses aqueous etching compositions containing TMAH, hydrogen peroxide, and aromatic sulfonic acids such as benzyl sulfonic acid. The compositions are primarily used for the selective wet etching of metal nitrides.

The American US 2010/0319735 A1 discloses cleaning compositions which are capable of removing both organic soiling and particulate soiling adhered to a substrate for an electronic device. The cleaning compositions contain a water-soluble salt containing a transition metal, a chelating agent and a peroxide. Additionally, the cleaning compositions can contain alkali agents such as ammonia, tetramethylammonium hydroxide and tetraethylammonium hydroxide, anionic surfactants such as linear alkyl benzenesulfonates, alkyl sulfates and alkylether sulfates, and nonionic surfactants such as alkyleneoxide adducts of higher alcohols.

However, the hydrophilizing effect of these prior art etching and cleaning compositions needs considerable improvement in order to be able to meet the increasingly stricter demands of the modern processes for manufacturing highly efficient solar cells.

In particular, the unsatisfactory hydrophilicity of the surfaces of the silicon substrates, especially, of the surface of silicon wafer surfaces, makes it difficult to evenly distribute highly polar spray-on phosphorus sources which, in turn, leads to an unsatisfactory phosphorus doping and, consequently, to solar cells having an unacceptably low efficiency.

After the removal of the etching and cleaning compositions, phosphorus emitter sources can be applied single-sided or double-sided onto the silicon wafer surfaces in the next process step. The applied phosphorus emitter sources are heated, for example, in an infrared-heated belt furnace so that the phosphorus emitter diffuses into the silicon substrate.

In this process step, a layer or zone of phosphorus silicate glass (PSG) and second zone the so-called dead layer, which consists of non-electrically active phosphorus, are formed on top of the surface of the silicon wafers.

However, whereas the layer PSG layer can be substantially removed by a hydrofluoric acid treatment in the next process step, this is not the case with the dead layer. The dead layer however impairs the electrical characteristics of the solar cells and particularly decreases the short-circuit current and thereby the efficiency.

In the art, gaseous phosphorus sources such as $POCl_3$ can also be used for the generation of phosphorus emitters in the silicon substrate. In this case, no hydrophilizing step is required after the texturization of the silicon substrate. However, the problems associated with the dead layer remaining after the PSG layer removal still need to be remedied.

Moreover, the phosphorus emitter layer which is present on both sides and/or on the edges of the silicon substrate after the phosphorus doping must be isolated to prevent short-circuiting the solar cell. Edge isolation can be accomplished by laser edge isolation techniques after the metallization step or by wet chemical etching.

The wet chemical edge isolation is accomplished by immersing the rear side and the edges of the silicon substrate in a hydrogen fluoride containing composition. Due to surface tension effects between the substrate and the hydrogen fluoride containing composition, the emitter layer on the front side is not exposed to the etching. However, residues of porous silicon can remain which must be removed before the further processing of the silicon substrate.

Therefore, in modern process sequences for manufacturing devices generating electricity upon exposure to electromagnetic radiation, additional wet cleaning and surface modification steps followed by rinsing and drying are carried out after the PSG removal step and/or the wet edge isolation step and before a silicon nitride ($SiN_x$:H) antireflection coating is applied, for example, by physically enhanced chemical vapor deposition (PECVD). By way of such an additional wet cleaning and surface modification step the debris which is left over from the PSG removal step and/or the wet edge isolation step and/or has re-contaminated the silicon wafer surface as well as the dead layer and/or porous silicon residues are removed and the surface is modified by etching and oxidation.

It would be highly desirable, both in economic and technical terms, if the etching and cleaning compositions used in the hydrophilizing step could also be used for the additional wet cleaning and surface modification steps. The prior art etching and cleaning compositions may be suitable for both purposes to a certain extent. However, further improvements are needed in order to meet the ever-increasing technical and economical demands of the solar cell manufacturers.

OBJECTS OF THE INVENTION

It is the object of the present invention to provide a novel aqueous alkaline etching and cleaning composition which is particularly well-suited for treating the surface of silicon substrates, in particular silicon wafers, and does not exhibit the disadvantages of the prior art aqueous alkaline etching and cleaning compositions.

Additionally, the novel aqueous alkaline etching and cleaning composition should have a particularly high cleaning efficiency so that the formation of haze and the re-contamination of the surface of the silicon substrates are avoided.

Moreover, the novel aqueous alkaline etching and cleaning composition should have a particularly strong hydrophilizing effect so that the resulting hydrophilic surface can be exceptionally well wetted with highly polar spray-on phosphorus emitter sources such as aqueous or alcoholic phosphoric acid so that the emitter formation can be controlled precisely.

Additionally, the novel aqueous alkaline etching and cleaning composition should also be particularly well-suited as a wet cleaning and modification composition in the additional wet cleaning and modification step carried out after the PSG removal step. In particular, in the additional wet cleaning and surface modification step, the novel alkaline etching and cleaning composition should be capable of substantially completely removing not only the debris which is left over from the PSG removal step and/or has re-contaminated the surface of the silicon substrates, but also the dead layer. It should also be capable of modifying the surface by etching and oxidation. In this way the open circuit current and thus the efficiency of the photovoltaic or solar cells should be significantly improved.

Last but not least, the novel aqueous alkaline etching and cleaning composition should also be particularly well-suited for removing residues of porous silica remaining after a wet edge isolation step.

It is another object of the present invention to provide a novel method for treating the surface of silicon substrates, in particular the surface of silicon wafers, which method does not exhibit the disadvantages of the prior art.

Additionally, the novel method for treating the surface of silicon substrates should have a particularly high cleaning efficiency so that the formation of haze and the re-contamination of the surface of the silicon substrates is avoided.

Moreover, the novel method for treating the surface of silicon substrates should have a particularly strong hydrophilizing effect so that the resulting hydrophilic surface can be exceptionally well wetted with highly polar spray-on phosphorus emitter sources such as aqueous or alcoholic phosphoric acid so that the doping and the formation of the emitters can be controlled precisely.

Additionally, the novel method for treating the surface of silicon substrates should also be particularly well-suited for carrying out the additional wet cleaning and modification step after the PSG removal step. In particular, the additional wet cleaning and surface modification step should be capable of substantially completely removing not only the debris which is left over from the PSG removal step and/or has re-contaminated the silicon wafer surface, but also the dead layer. It should also be capable of modifying the surface by etching and oxidation. In this way the open circuit current and thus the efficiency of the photovoltaic or solar cells should be significantly improved.

Last but not least, the novel method for treating the surface of silicon substrates should also be particularly well-suited for removing residues of porous silica remaining after the wet edge isolation step.

It is still another object of the invention to provide a novel methods for manufacturing devices generating electricity upon exposure to electromagnetic radiation, in particular photovoltaic cells or solar cells, especially selective emitter solar cells, Metal Wrap Through (MWT) solar cells and Emitter Wrap Through (EWT) solar cells, which devices generate electricity upon the exposure to electromagnetic radiation with increased efficiencies and fill factors (FF) and which method should no longer exhibit the disadvantages of the prior art.

SUMMARY OF THE INVENTION

Accordingly, the novel aqueous alkaline etching and cleaning composition has been found, the said composition comprising:

(A) at least one quaternary ammonium hydroxide; and
(B) at least one component selected from the group consisting of
 (b1) water-soluble sulfonic acids and their water-soluble salts of the general formula I:

(b2) water-soluble phosphonic acids and their water-soluble salts of the general formula II:

(b3) water-soluble sulfuric acid esters and their water-soluble salts of the general formula III:

(b4) water-soluble phosphoric acid esters and their water-soluble salts of the general formula (IV):

(b5) water-soluble phosphoric acid esters and their water-soluble salts of the general formula (V):

wherein the index n=1 or 2; the variable X is selected from the group consisting of hydrogen, alkaline metal and alkaline-earth metal; the variable $R^1$ is selected from the group consisting of aliphatic moieties having 2 to 5 carbon atoms and at least one olefinically unsaturated double bond, and cycloaliphatic moieties having 4 to 6 carbon atoms and at least one olefinically unsaturated double bond; and the variable R is selected from the group consisting of aliphatic moieties having 2 to 5 carbon atoms and at least one olefinically unsaturated double bond, cycloaliphatic moieties having 4 to 6 carbon atoms and at least one olefinically unsaturated double bond, and alkylaryl moieties, wherein the aryl moieties are selected from benzene and naphthalene, the alkyl moieties are selected from methylene, ethane-diyl and propane-diyl and the phosphorus atom in the general formula II is bonded directly and the sulfur atom in the general formula III and the phosphorus atom in the general formulas IV and V are each bonded via an oxygen atom to an aliphatic carbon atom.

Hereinafter, the novel aqueous alkaline etching and cleaning composition is referred to as the "composition of the invention".

Additionally, the novel use of the composition of the invention for the treatment of semiconductor materials has been found, which use is hereinafter referred to as the "use of the invention".

Moreover, a novel method for treating the surface of a silicon substrate has been found, the said method comprising the steps of:
(1) providing an aqueous alkaline etching and cleaning composition comprising
 (A) at least one quaternary ammonium hydroxide; and
 (B) at least one component selected from the group consisting of
  (b1a) water-soluble sulfonic acids and their water-soluble salts of the general formula I:

(b2) water-soluble phosphonic acids and their water-soluble salts of the general formula II:

(b3) water-soluble sulfuric acid esters and their water-soluble salts of the general formula III:

(b4) water-soluble phosphoric acid esters and their water-soluble salts of the general formula (IV):

(b5) water-soluble phosphoric acid esters and their water-soluble salts of the general formula (V):

wherein the index n=1 or 2; the variable X is selected from the group consisting of hydrogen, alkaline metal and alkaline-earth metal; and the variable R is selected from the group consisting of aliphatic moieties having 2 to 5 carbon atoms and at least one olefinically unsaturated double bond, cycloaliphatic moieties having 4 to 6 carbon atoms and at least one olefinically unsaturated double bond, and alkylaryl moieties, wherein the aryl moieties are selected from benzene and naphthalene, the alkyl moieties are selected from methylene, ethane-diyl and propane-diyl, and the sulfur atom and the phosphorus atom in the general formulas Ia and II are each bonded directly and the sulfur atom in the general formula III and the phosphorus atom in the general formulas IV and V are each bonded via an oxygen atom to an aliphatic carbon atom;

(2) contacting at least one major surface of the silicon substrate at least once with the said aqueous alkaline etching and cleaning composition for a time and at a temperature sufficient to obtain a clean hydrophilic surface; and (3) removing the at least one major surface from the contact with the aqueous alkaline etching and cleaning composition.

Hereinafter, the novel method for treating the surface of a silicon substrate is referred to as the "treatment method of the invention".

Moreover, a novel method for manufacturing devices generating electricity upon the exposure to electromagnetic radiation has been found, the said method comprising the steps of (I) texturing at least one major surface of a silicon substrate with an etching composition, thereby generating a hydrophobic surface;

(II) hydrophilizing the hydrophobic surface by employing the treatment method of the invention;

(III) applying at least one spray-on phosphorus emitter source onto the hydrophilic surface;

(IV) heating the silicon substrate contacted with the emitter source, thereby forming phosphorus emitters within the silicon substrate or phosphorus emitters within the silicon substrate and a phosphorus silicate glass on top of the surface of the silicon substrate;

(V) modifying the upper layer of the silicon substrate containing the phosphorus emitters or removing the phosphorus silicate glass from the surface of the silicon substrate and, thereafter, modifying the upper layer of the silicon substrate containing the phosphorus emitters;

(VI) depositing an antireflective layer on top of the modified upper layer of the silicon substrate material containing the phosphorus emitters, thereby obtaining an intermediate; and (VII) further processing the intermediate to obtain the device.

Hereinafter, this novel method for manufacturing devices generating electricity upon the exposure to electromagnetic radiation is referred to as the "first manufacturing method of the invention".

Last but not least, a method for manufacturing devices generating electricity upon exposure to electromagnetic radiation has been found, the said method comprising the steps of (I) texturing at least one major surface of a silicon substrate with an etching composition, thereby generating a hydrophobic surface;

(II) treating the hydrophobic surface of the silicon substrate in a heated atmosphere containing at least one gaseous phosphorus emitter source, thereby forming phosphorus emitters within the silicon substrate or phosphorus emitters within the silicon substrate and a phosphorus silicate glass on top of the surface of the silicon substrate;

(III) modifying the upper layer of the silicon substrate containing the phosphorus emitters or removing the phosphorus silicate glass from the surface of the silicon substrate and, thereafter, modifying the upper layer of the silicon substrate containing the phosphorus emitters by the treatment method of the invention;

(IV) depositing an antireflective layer on top of the modified upper layer of the silicon substrate containing the phosphorus emitters, thereby obtaining an intermediate; and (V) further processing the intermediate to obtain the device.

Hereinafter, this novel method for manufacturing devices generating electricity upon the exposure to electromagnetic radiation is referred to as the "second manufacturing method of the invention".

Advantages of the Invention

In view of the prior art discussed above, it was surprising and could not be expected by the skilled artisan that the objects underlying the present invention could be solved by the composition, the use, the treatment method and the first and second manufacturing methods of the invention.

Thus, it was surprising that the composition of the invention no longer exhibited the disadvantages and drawbacks of the prior art aqueous alkaline etching and cleaning compositions for treating the surface of silicon substrates, in particular silicon wafers.

It was additionally surprising that the composition of the invention had a particularly high cleaning efficiency so that the formation of haze and the re-contamination of the surfaces of the silicon substrates were avoided.

Moreover, it was surprising that the composition of the invention had a particularly strong hydrophilizing effect so that the resulting hydrophilic surface could be exceptionally well wetted with highly polar spray-on phosphorus emitter sources such as aqueous or alcoholic phosphoric acid so that the doping and the formation of the emitters could be controlled precisely.

Moreover, the composition of the invention was also particularly well-suited as a wet cleaning and modification composition in the additional wet cleaning and modification step carried out after the PSG removal step in a process sequence for manufacturing devices, in particular photovoltaic cells and solar cells, generating electricity upon exposure to electromagnetic radiation. In particular, in the additional wet cleaning and surface modification step, the composition of the invention was capable of substantially completely removing not only the debris which was left over from the PSG removal step and/or had re-contaminated the silicon wafer surface, but also the dead layer. It was also capable of modifying the surface by etching and oxidation. In this way the open circuit current and thus the efficiency of the photovoltaic or solar cells were significantly improved.

Last but not least, the composition of the invention was particularly well-suited for removing residues of porous silica remaining after a wet edge isolation step.

It was also surprising that the use and the treatment method of the invention did not exhibit the disadvantages and drawbacks of the prior art methods for treating the surface of silicon substrates, in particular silicon wafers.

Moreover, the treatment method of the invention had a particularly high cleaning efficiency so that the formation of haze and the re-contamination of the surfaces of the silicon substrates were avoided.

Furthermore, the treatment method of the invention had a particularly strong hydrophilizing effect so that the resulting hydrophilic surface could be exceptionally well wetted with highly polar spray-on phosphorus emitter sources such as aqueous or alcoholic phosphoric acid so that the doping and the formation of the emitters could be controlled precisely.

Moreover, the treatment method of the invention was particularly well-suited for carrying out the additional wet cleaning and modification step after the PSG removal step. In particular, the additional wet cleaning and surface modification step was capable of substantially completely removing not only the debris which was left over from the PSG removal step and/or had re-contaminated the surface of the silicon substrate, but also the dead layer. It was also capable of modifying the surface by etching and oxidation. In this way the open circuit current and thus the efficiency of the photovoltaic or solar cells were significantly improved.

Last but not least, the treatment method of the invention was particularly well-suited for removing residues of porous silica remaining after a wet edge isolation step.

It was furthermore surprising that the first and second manufacturing method of the invention no longer exhibited the disadvantages and drawbacks of the prior art manufacturing methods but yielded devices, in particular photovoltaic cells or solar cells, especially selective emitters solar cells, Metal Wrap Through (MWT) solar cells and Emitter Wrap Through (EWT) solar cells, which generate electricity upon the exposure to electromagnetic radiation with increased efficiencies and fill factors (FF).

DETAILED DESCRIPTION OF THE INVENTION

The present invention is directed to the composition of the invention.

The composition of the invention is particularly useful and suitable for treating the surface of silicon substrates, including silicon alloy materials, in particular silicon germanium alloy materials.

The silicon substrates can be amorphous, monocrystalline or polycrystalline silicon semiconductor materials.

Most preferably, the silicon substrates are silicon wafers useful for manufacturing devices generating electricity upon the exposure to electromagnetic radiation, in particular photovoltaic or solar cells. Such silicon wafers can have different sizes. Preferably, they are 100 to 210 mm square or pseudosquare. Likewise, the thickness of the wafers can vary. Preferably, the thickness is in the range of 80 to 300 µm.

As is known in the art, silicon wafers can be produced in accordance with known and customary methods. Thus, silicon wafers can be manufactured by cutting silicon ingots or bricks. The single crystal ingots are e.g. grown with the Czochralski (CZ) method, by slowly pulling a seed shaft out of molten silicon, which is contained in a fusion furnace. Also the edge-defined film-fed growth (EFG) or string-ribbon process can be used. The polycrystalline silicon can be produced by heating silicon pieces in a crucible just above their melting temperature. This lets the silicon pieces grow together forming a massive silicon block also called ingot. This ingot is cut into bricks often using band saws. The bricks are finally cut into wafers with wire saws. However, as explained hereinbefore, a saw damage etch must be carried out after the sawing.

After their separation and cleaning from the cutting slurry, the silicon wafers are customarily checked for breakages and other errors, and are sorted into the photovoltaic or solar cell production process.

Customarily, the production process starts with the texturization and the saw damage removal. This is often followed by dipping silicon the wafers into different solutions, including aqueous alkaline and acidic solutions, whereby a hydrophobic wafer surface is obtained.

The composition of the invention is an aqueous composition. This means that the components of the composition hereinafter described are completely dissolved on the molecular level in water, preferably de-ionized water and most preferably ultrapure water.

Preferably, the composition of the invention is applied to the hydrophobic wafer surface.

Preferably, the composition of the invention is a highly diluted aqueous solution of the components hereinafter described. More preferably, it contains, based on the complete weight of the treatment composition, of from 80 to 99.9% by weight, more preferably 82.5 to 99.8% by weight and most preferably 85.5 to 99.75% by weight of water.

The composition of the invention is an alkaline or basic composition. Its pH can vary broadly and, therefore, can be easily and precisely adjusted to the particular requirements of the treatment method and the manufacturing method of the invention. Preferably, the pH is from 8 to 13, most preferably 9 to 12.

The first essential component of the composition of the invention is at least one, preferably one, quaternary ammonium hydroxide (A).

The quaternary ammonium hydroxides (A) are well-known in the art and described for example in the American US 2006/0226122 A1, page 2, paragraph [0025] 2 page 3, paragraph [0028], and page 4, paragraph [0037] in detail. Tetramethylammonium hydroxide (TMAH) and/or tetraethylammonium hydroxide (TEAH) is or are most preferably used.

The concentration of the quaternary ammonium hydroxide (A) can also vary broadly and, therefore, can be easily and precisely adjusted to the particular requirements of the treatment method and the manufacturing methods of the invention. Preferably, the concentration is in the range of from 0.1 to 5% by weight, more preferably 0.2 to 4.5% by weight and most preferably 0.3 to 4% by weight, the weight percentages is being based on the complete weight of the composition of the invention.

The second essential component of the composition of the invention is at least one, preferably one, component (B) selected from the group consisting of (b1) water-soluble sulfonic acids and their water-soluble salts of the general formula I:

$$(R^1-SO_3^-)_n X^{n+} \qquad (I),$$

(b2) water-soluble phosphonic acids and their water-soluble salts of the general formula II:

$$R-PO_3^{2-}(X^{n+})_{3-n} \qquad (II),$$

(b3) water-soluble sulfuric acid esters and their water-soluble salts of the general formula III:

$$(RO-SO_3^-)_n X^{n+} \qquad (III),$$

(b4) water-soluble phosphoric acid esters and their water-soluble salts of the general formula (IV):

$$RO\!-\!PO_3^{2-}(X^{n+})_{3-n} \qquad \text{(IV), and}$$

(b5) water-soluble phosphoric acid esters and their water-soluble salts of the general formula (V):

$$[(RO)_2PO_2^-]_nX^{n+} \qquad \text{(V);}$$

In the context of the present invention, "water-soluble" means that the relevant component (B) is completely dissolved in water on the molecular level.

In the general formulas I and II the index n equals 1 or 2, preferably 1.

The variable X is selected from the group consisting of hydrogen, alkali metal and alkaline-earth metal, preferably hydrogen and alkali metal, most preferably hydrogen and sodium.

The variable $R^1$ of the general formula I is selected from the group consisting of aliphatic moieties having 2 to 5, preferably 2 to 4 and most preferably 2 or 3 carbon atoms and at least one, preferably one olefinically unsaturated double bond, and cycloaliphatic moieties having 4 to 6, preferably 5 or 6 and most preferably 6 carbon atoms and at least one, preferably one, olefinically unsaturated double bond.

The moieties $R^1$ may be substituted with at least one inert, i.e., non-reactive, substituent such as fluorine or chlorine if such a substituent does not impair the solubility of the component (b1) in water. More preferably, the moieties $R^1$ are unsubstituted. Even more preferably, the moieties $R^1$ are selected from the group consisting of
vinyl;
prop-1-en-1-yl, prop-2-en-1-yl (allyl), alpha-methyl-vinyl;
but-1-en-, but-2-en- and but-1-en-1-yl, 2-methyl-prop-1-en-1-yl, but-2-en-2-yl;
pent-1-en-1-yl,-2-en-1-yl,-3-en-1-yl and -4-en-1-yl;
pent-1-en-2-yl,-1-en-2-yl,-3-en-2-yl and -4-en-2-yl;
pent-1-en-3-yl and -2-en-3-yl;
3-methyl-but-1-en-1-yl,-2-en-1-yl and -3-en-1-yl;
3-methyl-but-2-en-2-yl and -3-en-2-yl;
neopent-1-en-1-yl and -2-en-1-yl;
cyclobut-1-en-1-yl and -2-en-1-yl;
cyclopent-1-en-1-yl,-2-en-1-yl and -3-en-1-yl; and
cyclohex-1-en-1-yl,-2-en-1-yl and -3-en-1-yl groups.
Vinyl, prop-1-en-1-yl, prop-2-en-1-yl (allyl) and alpha-methyl-vinyl groups are most preferably used.

Therefore, the components (b1) most preferably used are selected from the group consisting of vinylsulfonic acid, allylsulfonic acid, prop-1-en-1-yl-sulfonic acid, and alpha-methyl-vinyl-sulfonic acid and their sodium salts.

The variable R of the general formulas II to V is selected from the group consisting of the aforementioned moieties $R^1$ and alkylaryl moieties, wherein the aryl moieties are selected from benzene and naphthalene, preferably benzene, the alkyl moieties are selected from methylene, ethane-diyl and propane-diyl, preferably methylene, and the phosphorus atom in the general formula II is bonded directly and the sulfur atom in the general formula III and the phosphorus atom in the general formulas IV and V are each bonded via an oxygen atom to an aliphatic carbon atom.

The aryl moieties may be substituted with at least one inert, i.e., non-reactive, substituent such as fluorine or chlorine if such a substituent does not impair the solubility of the component (b2) in water. More preferably, the aryl moieties are unsubstituted.

Therefore, the components (b2) most preferably used are selected from the group consisting of vinylphosphonic acid, allylphosphonic acid, prop-1-en-1-yl-phosphonic acid, alpha-methyl-vinyl-phosphonic acid and benzylphosphonic and their sodium salts.

The components (b3) most preferably used are selected from the group consisting of monovinyl, monoallyl, mono-prop-1-en-1-yl, mono-alpha-methyl-vinyl and monobenzyl sulfuric acid esters and their sodium salts.

The components (b4) most preferably used are selected from the group consisting of monovinyl, monoallyl, mono-prop-1-en-1-yl, mono-alpha-methyl-vinyl and monobenzyl phosphoric acid esters and their sodium salts.

The components (b5) most preferably used are selected from the group consisting of divinyl, diallyl, diprop-1-en-1-yl, di-alpha-methyl-vinyl and dibenzyl phosphoric acid esters and their sodium salts. Mixed phosphoric acid esters containing two different residues R can also be used.

The concentration of the component (B) in the composition of the invention can vary broadly and, therefore, can be adjusted easily and precisely to the particular requirements of the relevant treatment method and manufacturing method of the invention. Preferably, the concentration is in the range of from 0.001 to 1.5% by weight, more preferably 0.005 to 1.25% by weight and, most preferably, 0.01 to 1% by weight, the weight percentages being based on the complete weight of the composition of the invention.

In a preferred embodiment, the composition of the invention additionally contains at least one acid (C). Preferably, the acids (C) are volatile so that they are capable of evaporating without the formation of residues at comparatively low temperatures, i.e., temperatures below 200° C. More preferably, at least two and most preferably two acids (C) are used.

Particularly preferably, the acids (C) are selected from the group consisting of inorganic mineral acids, most preferably hydrochloric acid and nitric acid, and water-soluble carboxylic acids, most preferably formic acid and acetic acid. Most particularly preferably, one mineral acid (C) and one water-soluble carboxylic acid (C) are used.

The concentrations of the acids (C) in the composition of the invention can vary broadly and, therefore, can be adjusted easily and precisely to the particular requirements of the relevant treatment method and manufacturing method of the invention. Preferably, the concentration of the inorganic mineral acid (C) is in the range of from 0.005 to 2% by weight, more preferably 0.01 to 1.75% by weight and most preferably 0.015 to 1.5% by weight, the weight percentages being based on the complete weight of the composition of the invention.

In another preferred embodiment, the composition of the invention additionally contains at least one, preferably one, volatile, water-soluble base (D) selected from the group consisting of inorganic and organic bases containing at least one nitrogen atom.

More preferably, the volatile, water-soluble inorganic base (D) containing at least one, preferably one, nitrogen atom is a ammonia or hydroxylamine, even more preferably ammonia.

Most preferably, the volatile, water-soluble organic base (D) is selected from the group consisting of methyl-, dimethyl-, ethyl-, methylethyl-, diethyl-, 1-propyl- and isopropylamine, ethanolamine, diethanolamine and ethylenediamine.

Also the concentration of the volatile, water-soluble base (D) can vary broadly and, therefore, can be adjusted easily and precisely to the particular requirements of the relevant treatment method and manufacturing methods of the invention. Preferably, the concentration is in the range of from 0.05 to 3% by weight, more preferably 0.075 to 2.5% by weight and most preferably 0.1 to 2% by weight, the weight percentages being based on the complete weight of the composition of the invention.

In still another preferred embodiment, the composition of the invention additionally contains at least one, preferably one, oxidizing agent (E) selected from the group consisting of water-soluble organic and inorganic peroxides, more preferably inorganic peroxides.

Preferably, the water-soluble organic peroxides (E) are selected from the group consisting of benzyl peroxide, peracetic acid, urea hydrogen peroxide adduct and di-t-butyl peroxide.

Preferably, the inorganic peroxides (E) are selected from the group consisting of hydrogen peroxide, percarbonates, perborates, monopersulfates, dipersulfates and sodium peroxide.

The concentration of the oxidizing agent (E) in the composition of the invention can vary broadly and, therefore, can be adjusted easily and precisely to the particular requirements of the relevant treatment method and manufacturing methods of the invention. Preferably, the concentration is in the range of from 0.1 to 1.5% by weight, more preferably 0.2 to 1.2% by weight and most preferably 0.3 to 1% by weight, the weight percentages being based on the complete weight of the composition of the invention.

In yet another preferred embodiment, the composition of the invention contains at least one metal chelating agent (F) to increase the capacity of the composition to retain metal ions in solution and to enhance the dissolution of metallic residues on the surface of the silicon wafers. In principle, any customary and known metal chelating agent (F) may be used as long as it does not adversely interfere with the other components of the composition of the invention, e.g., by causing decompositions or unwanted precipitates.

Preferably, the metal chelating agent (F) is selected from the group consisting of carboxylic acids, hydroxycarboxylic acids, amino acids, hydroxyamino acids, phosphonic acids and hydroxyphosphonic acids and their salts, alcohols and phenols containing at least two hydroxyl groups, the said compounds containing or not containing functional groups containing at least one nitrogen atom.

Preferably, the salts of the metal chelating agents (F) are selected from the group consisting of ammonium salts, in particular, ammonium salts, methyl-, dimethyl-, trimethyl-, ethyl-, methylethyl-, diethyl-, methyldiethyl-, triethyl-, 1-propyl- and isopropylammonium salts, and ethanolammonium, diethanolammonium and ethylenediammonium salts; and alkali metal salts, in particular, sodium and potassium salts.

More preferably, the metal chelating agent (F) is selected from the group consisting of amino acid diacetates and hydroxy amino acid diacetates and their salts, in particular, methylglycine diacetate (MGDA; Trilon™ M; alpha-alanine diacetate), beta-alanine diacetate, glutamic acid diacetate, aspartic acid diacetate, serine diacetates and threonine diacetates and their salts, particularly preferably MGDA and its salts; (ethylenedinitrilo)tetraacetic acid (EDTA), butylenediaminetetraacetic acid, (1,2-cyclohexylenedinitrilo)tetraacetic acid (CyDTA), diethylenetriaminepentaacetic acid, ethylenediaminetetrapropionic acid, (hydroxyethyl) ethylenediaminetriacetic acid (HEDTA), N,N,N',N'-ethylenediaminetetra(methylenephosphonic) acid (EDTMP), triethylenetetraaminehexaacetic acid (TTHA), 1,3-diamino-2-hydroxypropane-N,N,N',N'-tetraacetic acid (DHPTA), methyliminodiacetic acid, propylenediaminetetraacetic acid, 1,5,9-triazacyclododecane-N,N',N'''-tris(methylenephosphonic acid) (DOTRP), 1,4,7,10-tetraazacyclododecane-N,N',N'',N'''-tetrakis(methylenephosphonic acid), (DOTP), nitrilotris(methylene)triphosphonic acid, diethylenetriaminepenta(methylenephosphonic acid) (DETAP), aminotri(methylenephosphonic acid), 1-hydroxyethylene-1,1-diphosphonic acid, bis(hexamethylene)triamine phosphonic acid, 1,4,7-triazacyclononane-N,N',N''-tri(methylenephosphonic acid) (NOTP), 2-phosphonobutane-1,2,4-tricarboxylic acid, nitrilotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, 5-sulfosalicylic acid, cysteine and acetylcysteine, gallic acid and their salts; catechol, propyl gallate, pyrogallol and 8-hydroxyquinoline.

Additional examples of suitable metal chelating agents (F) are disclosed in the American application US 2010/0319735 A1, page 2, paragraphs [0039] to [0042] and page 7, paragraphs [0133] to [0143].

Most preferably, the metal chelating agent (F) contains at least one group having a pKa of 10 to 13 because such metal chelating agents have a high affinity for metal containing residues.

The concentration of the metal chelating agent (F) in the composition of the invention can vary broadly and, therefore, can be adjusted easily and precisely to the particular requirements of the relevant treatment method and manufacturing method of the invention. Preferably, the concentration is in the range of from the 0.01 to 5% by weight, more preferably 0.05 to 2.5% by weight and most preferably 0.1 to 2% by weight, the weight percentages being based on a complete weight of the composition of the invention.

Most preferably, the composition of the invention contains the components (A), (B), (C) and (E) and most particularly preferably (A), (B), (C), (D) and/or (F) and (E) in the above-mentioned preferred concentrations, the remainder being water in each case.

The preparation of the composition of the invention does not offer any particularities but can be carried out preferably by adding the above described components (A) and (B) and optionally (C). optionally (D) and optionally (F), more preferably (A), (B), (C) and optionally (D)) and optionally (F) and most preferably (A), (B), (C) and (D) to water in concentrations which may be higher than the concentrations in the composition of the invention when used in the treatment method and the manufacturing methods of the invention. This way, a concentrate is prepared which can be handled and stored without problems and may be diluted further with water before its use in the treatment method and manufacturing methods of the invention. Preferably, the component (E) is added shortly before use.

For the preparation of the composition of the invention, customary and standard mixing processes and corrosion resistant mixing devices such as agitated vessels, in-line dissolvers, high shear impellers, ultrasonic mixers, homogenizer nozzles or counterflow mixers can be used.

The composition of the invention is excellently suited for the use of the invention.

The use of the invention concerns the treatment of silicon substrates, in particular the treatment of silicon wafers.

According to the use of the invention, the silicon wafers are used for manufacturing devices generating electricity upon exposure to electromagnetic radiation, in particular the manufacturing of photovoltaic cells and solar cells, especially of selective emitter solar cells, Metal Wrap Through (MWT) solar cells and Emitter Wrap Through (EWT) solar cells. Therefore, the electromagnetic radiation is preferably solar radiation.

According to the use of the invention, the composition of the invention is most preferably used for the modification of the surface of the silicon substrates by etching and oxidation, the removal of phosphorus silicate glass and dead layers generated by the phosphorus emitter doping, the removal of porous silicon generated by the wet edge isolation and/or the removal of debris which has re-contaminated the surface of the silicon substrates.

The treatment method of the invention renders the surface of the silicon substrates, in particular the surface of silicon wafers, hydrophilic and/or modifies the surface of silicon substrates by etching and oxidation.

In the first step of the treatment method of the invention, an aqueous alkaline etching and cleaning composition is provided, preferably by the methods described hereinbefore.

The aqueous alkaline etching and cleaning composition comprises at least one quaternary ammonium hydroxide (A) as described hereinbefore.

It furthermore comprises at least one component (B) selected from the group consisting of (b1a) water-soluble sulfonic acids and their water-soluble salts of the general formula I:

$$(R-SO_3^-)_n X^{n+} \qquad (Ia),$$

(b2) water-soluble phosphonic acids and their water-soluble salts of the general formula II:

$$R-PO_3^{2-}(X^{n+})_{3-n} \qquad (II),$$

(b3) water-soluble sulfuric acid esters and their water-soluble salts of the general formula III:

$$(RO-SO_3^-)_n X^{n+} \qquad (III),$$

(b4) water-soluble phosphoric acid esters and their water-soluble salts of the general formula (IV):

$$RO-PO_3^{2-}(X^{n+})_{3-n} \qquad (IV), \text{ and}$$

(b5) water-soluble phosphoric acid esters and their water-soluble salts of the general formula (V):

$$[(RO)_2 PO_2^-]_n X^{n+} \qquad (V);$$

wherein the index n=1 or 2; the variable X is selected from the group consisting of hydrogen, alkaline metal and alkaline-earth metal; and the variable R is selected from the group consisting of aliphatic moieties having 2 to 5, preferably 2 to 4 and most preferably 2 or 3 carbon atoms and at least one, preferably one olefinically unsaturated double bond, cycloaliphatic moieties having 4 to 6, preferably 5 or 6 and most preferably 6 carbon atoms and at least one, preferably one olefinically unsaturated double bond, and alkylaryl moieties, wherein the aryl moieties are selected from benzene and naphthalene, preferably benzene, the alkyl moieties are selected from methylene, ethane-diyl and propane-diyl, preferably ethane-diyl, and the sulfur atom and the phosphorus atom in the general formulas Ia and II are each bonded directly and the sulfur atom in the general formula III and the phosphorus atom in the general formulas IV and V are each bonded via an oxygen atom to an aliphatic carbon atom.

Preferably, the variable R is selected from the group consisting of the moieties R as described hereinbefore.

Most preferably, the component (B) is selected from the group consisting of the aforementioned most preferably used water-soluble acids and their water-soluble salts (b1), (b2), (b3), (b4) and (b5) and benzylsulfonic acid and its salts.

More preferably, the aqueous alkaline etching and cleaning composition furthermore contains the components (C), (E) and optionally (D), most preferably (C), (D) and (E).

In the second step of the treatment method of the invention, one of the major surfaces or the two opposing major surfaces of the silicon substrate, preferably of the silicon wafer, is or are contacted at least once with the aqueous alkaline etching and cleaning composition for a time, preferably 30 seconds to 10 minutes, and at a temperature, preferably 20° C. to 60° C., which are sufficient to obtain a clean hydrophilic surface or two clean hydrophilic surfaces.

This can be accomplished, for example, by dipping at least one silicon substrate, in particular at least one silicon wafer, in its entirety either horizontally or vertically in a tank filled with the aqueous alkaline etching and cleaning composition or by conveying at least one silicon substrate, preferably by a system of conveyor rolls, essentially horizontally through a tank filled with the said composition.

In the third step of the treatment method of the invention, the at least one major surface is removed from the contact with the aqueous alkaline etching and cleaning composition The composition and the treatment method of the invention can be advantageously used in manufacturing processes of various semiconductor devices. Most preferably, they are used in the manufacturing methods of the invention.

The first and second manufacturings method of the invention yield semiconductor devices, in particular photovoltaic or solar cells, which are capable of generating electricity upon exposure to electromagnetic radiation, in particular solar light.

The first step of the first and second manufacturing methods of the invention is preceded by process steps customary and known in the art of manufacturing solar cells.

In the first step of the first and second manufacturing methods of the invention, at least one major surface of a silicon substrate, preferably a silicon wafer, is textured with an etching composition which is known in the art. This way, a hydrophobic surface is obtained.

The first step may be followed by neutralizing, rinsing and drying steps.

In the second step of the first manufacturing method of the invention, at least one major surface of the said substrate is subjected to the treatment method of the invention as described hereinbefore in detail. This way, the former hydrophobic surface or surfaces is or are converted into a hydrophilic surface or into hydrophilic surfaces.

The second step may also be followed by rinsing and drying steps.

In the third step of the first manufacturing method of the invention, at least one, preferably one, spray-on phosphorus emitter source, preferably a liquid phosphorus emitter source, particularly diluted aqueous or alcoholic phosphoric acid, is applied onto the hydrophilic surface or surfaces.

Thereafter, in the fourth step of the first manufacturing method of the invention, the surface or the surfaces of the silicon substrate contacted with the phosphorus emitter source is or are heated, for example, in an infrared heated belt furnace, thereby forming the phosphorus emitters within the silicon substrate. A phosphorus (PSG) silicate glass layer may also be formed on top of the surface or the surfaces of the silicon substrate in this process step.

In the fifth step of the first manufacturing method of the invention, the PSG layer if present is removed from the surface or the surfaces of the silicon substrate, preferably by a hydrofluoric acid treatment.

This optional step may be followed by neutralizing, rinsing and drying steps.

In the fifth step of the first manufacturing method of the invention, the upper layer of the silicon substrate material containing the phosphorus emitters is modified. Most preferably, the modification is accomplished by the treatment method of the invention.

Again, the fifth step may be followed by rinsing and drying steps.

In the sixth step of the first manufacturing method of the invention, an anti-reflective layer is deposited on top of the modified upper layer of the silicon substrate containing the phosphorus emitters, thereby obtaining an intermediate for further processing.

In the further course of the first manufacturing method of the invention, the intermediate is further processed by way of process steps customary and known in the art of manufacturing solar cells thus yielding devices, in particular photovoltaic and solar cells, in exceptionally high yields, which devices generate electricity upon the exposure to electromagnetic radiation and have high efficiencies and a uniform appearance.

In the second manufacturing method of the invention, the hydrophobic surface of the silicon substrate is treated in a heated atmosphere containing at least one gaseous phosphorus emitter source, preferably $POCl_3$, thereby forming phosphorus emitters within the silicon substrate or phosphorus emitters within the silicon substrate and a phosphorus silicate glass (PSG) on top of the surface of the silicon substrate.

Preferably, the heat treatment is carried out in a diffusion furnace, in particular a tube furnace for diffusion applications. To this end, the silicon substrates are mounted vertically in a quartz boat holder, then inserted batchwise into the furnace and then subjected to a batchwise treatment.

Thereafter, in the next step of the second manufacturing method of the invention, the surface or the surfaces of the silicon substrate contacted with the gaseous phosphorus emitter source is or are heated, for example, in an infrared heated belt furnace, In the next step of the second manufacturing method of the invention, the PSG layer if present is removed from the silicon substrate surface or surfaces, preferably by a hydrofluoric acid treatment.

This optional step may be followed by neutralizing, rinsing and drying steps.

In the next step of the second manufacturing method of the invention, the upper layer of the silicon substrate containing the phosphorus emitters is modified. Most preferably, the modification is accomplished by the treatment method of the invention.

Again, this step may be followed by rinsing and drying steps.

In the next step of the second manufacturing method of the invention, an anti-reflective layer is deposited on top of the modified upper layer of the silicon substrate containing the phosphorus emitters, thereby obtaining an intermediate for further processing.

In the further course of the second manufacturing method of the invention, the intermediate is further processed by way of process steps customary and known in the art of manufacturing solar cells thus yielding devices, in particular photovoltaic and solar cells, especially selected emitters solar cells in exceptionally high yields, which devices generate electricity upon the exposure to electromagnetic radiation and have high efficiencies and a uniform appearance.

Both, in the first and second manufacturing methods of the invention, a wet edge isolation step can be carried out before an anti-reflective layer is deposited on top of the modified semiconductor material containing the phosphorus emitters. Thereafter, porous silicon generated by the wet edge isolation and re-contaminating debris can be removed by the treatment method of the invention. This way, the applicational properties of the photovoltaic cells and the solar cells, especially of the selective emitter solar cells, Metal Wrap Through (MWT) solar cells and Emitter Wrap Through (EWT) solar cells, are further improved.

EXAMPLES AND COMPARATIVE EXPERIMENTS

Examples 1 to 3 and Comparative Experiments C1 to C5

The Hydrophilizing Efficiency of Aqueous Alkaline Etching and Cleaning Compositions Containing Allylsulfonic Acid Sodium Salt (Examples 1 to 3) and No Allylsulfonic Acid Sodium Salt (Comparative Experiments C2 to C5), and of Water (Comparative Experiment C1)

For the Examples and the Comparative Experiments, the aqueous alkaline etching and cleaning compositions were prepared by dissolving their components in ultrapure water. The relevant compositions are listed in the Table 1.

TABLE 1

The Compositions in percent by weight of the Aqueous Alkaline Etching and Cleaning Compositions of the Examples 1 to 3 and the Comparative Experiments C2 to C5

| CE.[a]/ Ex.[b] | Water (%) | TMAH[c] (%) | HAc[d] (%) | $NH_3$ (%) | HCl (%) | Allylsulfonic acid (%) | pH |
|---|---|---|---|---|---|---|---|
| C1 | 100 | — | — | — | — | — | 7 |
| C2 | 95.42 | 3.5 | — | — | 1.08 | — | 9.6 |
| C3 | 94.58 | 3.5 | 1.2 | — | 0.72 | — | 9.6 |
| C4 | 94.06 | 3.5 | — | 1 | 1.44 | — | 9.6 |
| C5 | 92.86 | 3.5 | 1.2 | 1 | 1.44 | — | 9.6 |
| 1 | 92.66 | 3.5 | 1.2 | 1 | 1.44 | 0.2 | 9.6 |
| 2 | 92.26 | 3.5 | 1.2 | 1 | 1.44 | 0.6 | 9.6 |
| 3 | 91.86 | 3.5 | 1.2 | 1 | 1.44 | 1 | 9.6 |

[a]CE. = Comparative Experiment;
[b]Ex. = Example;
[c]TMAH = tetramethylammonium hydroxide;
[d]Hac = acetic acid For the wetting experiments, i.e., the determination of the hydrophilizing efficiencies, 1 part by weight of each composition of the Comparative Experiments C2 to C5 and of the Examples 1 to a 3 was diluted with 6 parts by weight of ultrapure water and 1 part by weight of hydrogen peroxide (30% by weight in water) so that aqueous alkaline etching and cleaning compositions having a hydrogen peroxide content of 0.83% by weight, based on the complete weight of the relevant composition, were obtained in each case. The hydrophilizing efficiencies of the said diluted compositions and of water was determined as follows.

Silicon wafer pieces having a surface rendered hydrophobic by a hydrofluoric acid treatment were dipped into water (Comparative Experiment C1) and into each of the compositions obtained by diluting each of the compositions of the Comparative Experiments C2 to C5 and the Examples 1 to 3 (cf. Table 1) at 40° C. for 2 minutes. Thereafter, the silicon wafer pieces were rinsed and dried.

In each case, six 200 µl droplets of phosphoric acid (2% by weight in alcohol were dripped onto the same surface of each dried silicon wafer piece. In each case, the areas of each of the six spread droplets were measured by software supported photographic image processing after 5 minutes spreading time. The corrected average area value and the corrected standard deviation were calculated in each case. For purposes of clearness, the obtained average area values were compared with the area of a 1 Euro coin as reference, the area of which was defined to be 100%. The values thus obtained are compiled in the Table 2.

TABLE 2

The Hydrophilizing Efficiency of Water (Comparative Experiment C1) and of the Diluted Compositions of the Comparative Experiments C2 to C5 and the Examples 1 to 3 in Percent of the 1 Euro Coin Area As the Reference

| CE.[a]/Ex.[b] | Hydrophilizing Efficiency (% of 1 Euro coin area) |
|---|---|
| C1 | 22.70 |
| C2 | 82.72 |
| C3 | 50.86 |
| C4 | 74.31 |
| C5 | 78.42 |
| 1 | 51.26 |
| 2 | 101.96 |
| 3 | 62.10 |

[a]CE. = Comparative Experiment;
[b]Ex. = Example

Although the diluted compositions of the Comparative Experiments C2, C4 and C5 exhibited a higher wetting efficiency than the diluted compositions of the Examples 1 and 3, they could not be used in an industrial process for manufacturing photovoltaic or solar cells because they were not stable under the process conditions. Moreover, the etching effect of the said diluted compositions caused an inferior quality of the hydrophilized surface. Additionally, the etching and cleaning results were difficult to reproduce. This equally applies to the composition of the Comparative Experiment C3. Moreover, all the diluted compositions of the Comparative Experiments C2 to C5 could not be used as wet cleaning and modification compositions in the additional wet cleaning and modification step carried out after the PSG removal step.

In contrast to this, the diluted compositions of the Examples 1 to 3 were particularly stable. In particular, due to their excellent buffering capacity, the pH of the said diluted compositions did not change upon increasing the acid concentration in a wide range. Therefore, their hydrophilizing efficiency remained stable under the conditions of an industrial process for manufacturing photovoltaic or solar cells. Moreover, they yielded smooth etched surfaces having an advantageous micro-roughness. Furthermore, the etching and cleaning results were reproducible in an excellent manner. Last but not least, they were excellently suited as wet cleaning and modification compositions in the additional wet cleaning and modification step carried out after the PSG removal.

Example 4

The Pilot Plant Scale Production of Solar Cells Employing the Diluted Composition of the Example 2

Solar cells were produced in a pilot plant scale production line. In the relevant process steps, wherein the diluted composition of the Example 2 was employed, the silicon wafers were conveyed horizontally through the etching and cleaning baths by way of alkaline stable conveyer rolls.

The relevant surfaces of the silicon wafers were textured with an aqueous acidic etching composition containing hydrofluoric acid. This way, hydrophobic surfaces were obtained. Thereafter, the hydrophobic silicon wafers were neutralized, rinsed and dried.

Thereafter, the hydrophobic silicon wafers were conveyed through a bath containing the diluted composition of the Example 2 at 40° C. at a conveying speed that each silicon wafer was contacted with the diluted composition for 2 minutes. This way, the former hydrophobic surfaces of the wafers were converted into hydrophilic surfaces. Thereafter, the silicon wafers were rinsed and dried.

In the following step, phosphoric acid (2% by weight in alcohol) was applied as the liquid phosphorus emitter source onto the hydrophilic surfaces of the silicon wafers.

Thereafter, the surfaces of the silicon wafers coated with the liquid emitter source were heated, thereby forming the phosphorus emitters within the silicon substrate material and a PSG layer on top of the silicon wafer surfaces.

Then, the PSG layers were removed from the surface of the silicon wafers by a 10% hydrofluoric acid treatment. Thereafter, the silicon wafers were neutralized, rinsed and dried.

In the following step, the relevant surfaces of each silicon wafer were cleaned from PSG residues and modified by treating the wafers with the diluted composition of the Example 202 at about 50° C. for 2 minutes. Thereafter, the silicon wafers were treated with a 1% hydrofluoric acid, rinsed and dried.

A hydrogen doped silicon nitride layer was then applied on top of one of the modified surfaces of the silicon wafers as a passivating and antireflective layer by physically enhanced chemical vapor deposition (PECVD) to obtain intermediates.

Thereafter, the intermediates were further processed by way of process steps customary and known in the art of manufacturing solar cells thus yielding solar cells having high efficiencies and a uniform appearance in high yields The determination of the electrical characteristics of the solar cells thus obtained gave superior results indicating cell efficiency gains in the range of 0.1-004% as compared with the efficiencies of solar cells produced by prior art processes.

We claim:

1. An aqueous composition, comprising:
   a quaternary ammonium hydroxide; and
   at least one component selected from the group consisting of a water-soluble sulfonic acid or its water-soluble salt of formula I:

$$(R^1-SO_3^-)_n X^{n+} \qquad (I),$$

a water-soluble phosphonic acid or its water-soluble salt of formula II:

$$R-PO_3^{2-}(X^{n+})_{3-n} \qquad (II),$$

a water-soluble sulfuric acid ester or its water-soluble salt of formula III:

$$(RO-SO_3^-)_n X^{n+} \qquad (III),$$

a water-soluble phosphoric acid ester or its water-soluble salt of formula IV:

$$RO-PO_3^{2-}(X^{n+})_{3-n} \qquad (IV), \text{ and}$$

a water-soluble phosphoric acid ester or its water-soluble salt of formula V:

$$[(RO)_2 PO_2^-]_n X^{n+} \qquad (V),$$

wherein
   the aqueous composition is alkaline;
   n=1 or 2;
   X is selected from the group consisting of a hydrogen, an alkaline metal and an alkaline-earth metal;
   $R^1$ is selected from the group consisting of an aliphatic moiety comprising 2 to 5 carbon atoms and an olefinically unsaturated double bond, and a cycloaliphatic moiety comprising 4 to 6 carbon atoms and an olefinically unsaturated double bond;
   R is selected from the group consisting of an aliphatic moiety comprising 2 to 5 carbon atoms and an olefinically unsaturated double bond, a cycloaliphatic moiety comprising 4 to 6 carbon atoms and an olefinically unsaturated double bond, and an alkylaryl moiety, comprising an aryl moiety and an alkyl moiety,
the aryl moiety is a benzene or a naphthalene,
the alkyl moiety is a methylene, an ethane-diyl, or a propane-diyl,
a phosphorus atom in formula II is bonded directly to an aliphatic carbon atom,
a sulfur atom in formula III is bonded via an oxygen atom to an aliphatic carbon atom,
a phosphorus atom in formula IV is bonded via an oxygen atom to an aliphatic carbon atom, and
a phosphorous atom in formula V is bonded via an oxygen atom to an aliphatic carbon atom.

2. The composition according to claim 1, wherein the quaternary ammonium hydroxide is at least one selected from the group consisting of a tetramethylammonium hydroxide and a tetraethylammonium hydroxide.

3. The composition according to claim 1, wherein $R^1$ is selected from a vinyl, a prop-1-en-1-yl, a prop-2-en-1-yl and an alpha-methyl-vinyl, and R is selected from a vinyl, a prop-1-en-1-yl, a prop-2-en-1-yl, an alpha-methyl-vinyl and a benzyl.

4. The composition according to claim 1, further comprising at least one acid selected from the group consisting of an inorganic mineral acid and a water-soluble carboxylic acid.

5. The composition according to claim 1, further comprising at least one base selected from the group consisting of a volatile inorganic base comprising a nitrogen atom and an organic base comprising a nitrogen atom.

6. The composition according to claim 1, further comprising at least one oxidizing agent selected from the group consisting of a water-soluble organic peroxide and a water-soluble inorganic peroxide.

7. The composition according to claim 1, further comprising a metal chelating agent.

8. The composition according to claim 7, wherein the metal chelating agent is at least one selected from the group consisting of an amino acid diacetate, an amino acid diacetate salt, a hydroxyamino acid diacetate, and a hydroxyamino acid diacetate salt.

9. The composition according to claim 1, wherein the composition has a pH of from 8 to 13.

10. A method of treating a silicon substrate, wherein the method comprises:
contacting the silicon substrate with the composition according to claim 1.

11. The method according to claim 10, wherein the silicon substrate is a silicon wafer.

12. A method of manufacturing a device, comprising treating a silicon substrate by the method according to claim 11, wherein the device is suitable for generating electricity upon exposure to an electromagnetic radiation.

13. The method according to claim 12, wherein the device is at least one selected from the group consisting of a photovoltaic cell and a solar cell.

14. The method according to claim 13, wherein the device is a solar cell, and
the solar cell is a selective emitter solar cell, a Metal Wrap Through (MWT) solar cell, or an Emitter Wrap Through (EWT) solar cell.

15. The method according to claim 12, wherein the electromagnetic radiation is a solar radiation.

16. The method according to claim 10, wherein the contacting comprises at least one selected from the group consisting of
modifying a surface of the silicon substrate by etching and oxidation,
removing a phosphorus silicate glass and a dead layer generated by a phosphorus emitter doping,
removing a porous silicon generated by a wet edge isolation, and
removing debris which has re-contaminated the surface of the silicon substrate.

17. A method for treating the surface of a silicon substrate comprising:
contacting a first major surface of the silicon substrate at least once with an aqueous alkaline composition to obtain a clean hydrophilic surface;
removing the first major surface from the contact with the aqueous alkaline composition;
wherein
the aqueous alkaline composition comprises:
a quaternary ammonium hydroxide; and
at least one component selected from the group consisting of a water-soluble sulfonic acid or its water-soluble salt of formula Ia:

$$(R—SO_3^-)_n X^{n+} \qquad (Ia),$$

a water-soluble phosphonic acid or its water-soluble salt of formula II:

$$R—PO_3^{2-}(X^{n+})_{3-n} \qquad (II),$$

a water-soluble sulfuric acid ester or its water-soluble salt of formula III:

$$(RO—SO_3^-)_n X^{n+} \qquad (III),$$

a water-soluble phosphoric acid ester or its water-soluble salt of formula (IV):

$$RO—PO_3^{2-}(X^{n+})_{3-n} \qquad (IV), \text{ and}$$

a water-soluble phosphoric acid ester or its water-soluble salt of formula (V):

$$[(RO)_2PO_2^-]_n X^{n+} \qquad (V),$$

wherein
n=1 or 2;
X is selected from the group consisting of a hydrogen, an alkaline metal and an alkaline-earth metal;
R is selected from the group consisting of an aliphatic moiety comprising 2 to 5 carbon atoms and an olefinically unsaturated double bond, a cycloaliphatic moiety comprising 4 to 6 carbon atoms and an olefinically unsaturated double bond, and an alkylaryl moiety, comprising an aryl moiety and an alkyl moiety,
the aryl moiety is a benzene or a naphthalene,
the alkyl moiety is a methylene, an ethane-diyl or a propane-diyl,
a sulfur atom in formula Ia is bonded directly to an aliphatic carbon atom,
a sulfur atom in formula II is bonded directly to an aliphatic carbon atom,
a phosphorous atom in formula Ia is bonded directly to an aliphatic carbon atom,
and a phosphorus atom in formula II is bonded directly to an aliphatic carbon atom,
a sulfur atom in the formula III is bonded via an oxygen atom to an aliphatic carbon atom,
a phosphorus atom in formula IV is bonded via an oxygen atom to an aliphatic carbon atom, and
a phosphorous atom in formula V is bonded via an oxygen atom to an aliphatic carbon atom.

18. The method according to claim 17, further comprising:
contacting a second major surface of the silicon substrate with the aqueous alkaline composition, after the removing.

19. The method according to claim 17, wherein the silicon substrate is a silicon wafer.

20. A method for manufacturing a device, the method comprising:
   texturing a major surface of a silicon substrate with an etching composition, thereby generating a hydrophobic surface;
   hydrophilizing the hydrophobic surface by the method of claim 17, thereby obtaining a hydrophilic surface;
   applying a spray-on phosphorus emitter source onto the hydrophilic surface;
   heating the silicon substrate contacted with the emitter source, thereby obtaining a phosphorus emitter within the silicon substrate or optionally a phosphorus silicate glass on top of a surface of the silicon substrate;
   modifying an upper layer of the silicon substrate comprising the phosphorus emitter, thereby obtaining a modified upper layer, or
   removing the phosphorus silicate glass from a surface of the silicon substrate and, thereafter, modifying the upper layer of the silicon substrate comprising the phosphorus emitter, thereby obtaining a modified upper layer;
   depositing an antireflective layer on top of the modified upper layer, thereby obtaining an intermediate; and
   further processing the intermediate to obtain the device.

21. The method of claim 20, wherein the modifying comprises: texturing a first major surface of the silicon substrate with an etching composition to obtain a hydrophobic surface;
   contacting the hydrophobic surface of the first major surface of the silicon substrate at least once with an aqueous alkaline composition to obtain a clean hydrophilic surface; and
   removing the hydrophilic surface of the first major surface from the contact with the aqueous alkaline composition.

22. The method of claim 20, further comprising: a wet edge isolating between the modifying and the depositing.

23. The method of claim 22, further comprising after the wet edge isolating:
   texturing a first major surface of the silicon substrate with an etching composition to obtain a hydrophobic surface;
   contacting the hydrophobic surface of the first major surface of the silicon substrate at least once with an aqueous alkaline composition to obtain a clean hydrophilic surface; and
   removing the hydrophilic surface of the first major surface from the contact with the aqueous alkaline composition.

24. The method according to claim 20, wherein the device is at least one selected from the group consisting of a photovoltaic cell and a solar cell.

25. The method according to claim 24, wherein the device is a solar cell, and the solar cell is a selective emitter solar cell, a Metal Wrap Through (MWT) solar cell or an Emitter Wrap Through (EWT) solar cell.

26. A method for manufacturing a device, the method comprising:
   texturing a major surface of a silicon substrate with an etching composition, thereby generating a hydrophobic surface;
   treating the hydrophobic surface of the silicon substrate in a heated atmosphere comprising a gaseous phosphorus emitter source, thereby obtaining a phosphorus emitter within the silicon substrate or optionally a phosphorus silicate glass on top of a surface of the silicon substrate;
   modifying an upper layer of the silicon substrate comprising the phosphorus emitter or removing the phosphorus silicate glass from the surface of a silicon semiconductor and, thereafter, modifying the upper layer of the silicon substrate comprising the phosphorus emitter, in either case by the method for treating the surface of the silicon substrate according to the method of claim 17, thereby obtaining a modified upper layer;
   depositing an antireflective layer on top of the modified upper layer of the silicon substrate, thereby obtaining an intermediate; and
   further processing the intermediate to obtain the device.

27. The method of claim 26, further comprising: a wet edge isolating between the modifying and the depositing.

28. The method of claim 27, further comprising after the wet edge isolating:
   texturing a first major surface of the silicon substrate with an etching composition to obtain a hydrophobic surface;
   contacting the hydrophobic surface of the first major surface of the silicon substrate at least once with an aqueous alkaline composition to obtain a clean hydrophilic surface; and
   removing the hydrophilic surface of the first major surface from the contact with the aqueous alkaline composition.

29. The method according to claim 26, wherein the device is at least one selected from the group consisting of a photovoltaic cell and a solar cell.

30. The method according to claim 29, wherein the device is a solar cell, and the solar cell is a selective emitter solar cell, a Metal Wrap Through (MWT) solar cell or an Emitter Wrap Through (EWT) solar cell.

31. The composition according to claim 3, wherein the water-soluble sulfonic acid or its water-soluble salt of formula I is present, and $R^1$ is prop-2-en-1-yl.

32. The method according to claim 10, wherein said contacting comprises additional wet cleaning and modifying after removal of a phosphorus silicate glass.

* * * * *